US009990250B2

(12) United States Patent
Uliana et al.

(10) Patent No.: US 9,990,250 B2
(45) Date of Patent: Jun. 5, 2018

(54) SINGLE-IC LDPC ENCODING AND DECODING IMPLEMENTATIONS

(71) Applicant: NATIONAL INSTRUMENTS CORPORATION, Austin, TX (US)

(72) Inventors: David C. Uliana, Austin, TX (US); James W. McCoy, Austin, TX (US); Newton G. Petersen, Emporia, KS (US); Tai A. Ly, Austin, TX (US); Hojin Kee, Austin, TX (US); Adam T. Arnesen, Pflugerville, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 0 days. days.

(21) Appl. No.: 14/725,812

(22) Filed: May 29, 2015

(65) Prior Publication Data

US 2016/0352355 A1    Dec. 1, 2016

(51) Int. Cl.
| | |
|---|---|
| *G06F 11/00* | (2006.01) |
| *H03M 13/00* | (2006.01) |
| *G06F 11/10* | (2006.01) |
| *H03M 13/11* | (2006.01) |

(52) U.S. Cl.
CPC ..... *G06F 11/1008* (2013.01); *H03M 13/1102* (2013.01); *H03M 13/116* (2013.01); *H03M 13/611* (2013.01); *H03M 13/6502* (2013.01); *H03M 13/6561* (2013.01)

(58) Field of Classification Search
CPC ........... H03M 13/1105; H03M 13/116; H03M 13/1137; H03M 13/255; G06F 11/1008; G06F 11/10

USPC ....... 714/758, 804, 805, 746, 750, 751, 752, 714/824, 791, 799–801, 712, 714, 715, 714/757
See application file for complete search history.

(56) References Cited

U.S. PATENT DOCUMENTS

| | | | |
|---|---|---|---|
| 8,185,797 B2 * | 5/2012 | Jun ........................ | G11B 20/18 714/758 |
| 8,413,029 B2 | 4/2013 | Rouschmayer | |
| 8,819,524 B2 | 8/2014 | Kou | |
| 2010/0031118 A1 * | 2/2010 | Blanksby ........... | H03M 13/1137 714/752 |
| 2012/0079341 A1 | 3/2012 | Wajcer | |

(Continued)

OTHER PUBLICATIONS

Shokrollahi, Amin—"LDPC Codes: An Introduction"—Apr. 2, 2003, pp. 1-34; Digital Fountain, Inc., Fremont, CA (34 pages).

(Continued)

*Primary Examiner* — Christine Tu
(74) *Attorney, Agent, or Firm* — Meyertons Hood Kivlin Kowert & Goetzel, P.C.; Jeffrey C. Hood; Michael B. Davis

(57) ABSTRACT

Techniques are disclosed relating to implementation of LDPC encoding circuitry on a single integrated circuit (IC). In some embodiments, circuitry on a single IC includes message circuitry configured to receive or generate a message to be encoded, encode circuitry configured to perform low density parity check (LDPC) encoding on the message, noise circuitry configured to apply noise to the encoded message, and decode circuitry configured to perform LDPC decoding of the message. In some embodiments, the disclosed techniques may reduce production costs (e.g., by reducing overall chip area), facilitate LDPC testing, and/or provide multiple different functions relating to message transmission on a single chip.

13 Claims, 15 Drawing Sheets

(56) References Cited

U.S. PATENT DOCUMENTS

| | | | |
|---|---|---|---|
| 2013/0132804 A1* | 5/2013 | Frayer | G06F 11/1012 |
| | | | 714/780 |
| 2013/0198581 A1* | 8/2013 | Lee | H03M 13/1117 |
| | | | 714/752 |
| 2014/0075258 A1 | 3/2014 | Miller | |
| 2015/0095726 A1* | 4/2015 | Cameron | G06F 11/076 |
| | | | 714/704 |
| 2015/0188574 A1 | 7/2015 | Yen | |

OTHER PUBLICATIONS

McGowan, James A. et al.—"Loop Removal from LDPC Codes" 2003 IEEE Proceedings of the Information Theory Workshop, Mar. 31-Apr. 4, 2003, pp. 230-233 (original document pp. 1-4) (4 pages).

* cited by examiner

*Code Block 1 – Matrix Multiplication*

```
bool shiftregister;
for(int i = 0; i < 6; i++)
{
    s = false;
    for(int j = 0; j < 3; j++)
    {
        s = s ^ (g[i][j] & u[j]);
    }
    v[i] = s;
}
```

*FIG. 5A*

*Code Block 2 – Matrix Multiplication with Unrolled Inner Loop*

```
for(int i = 0; i < 6; i++)
{
    v[i] = false ^ (g[i][0] & u[0]) ^ (g[i][1] & u[1]) ^ (g[i][2] & u[2]);
}
```

*FIG. 5B*

Code Block 3 – Matrix Multiplication using Representation for Sparse Matrix
```
for(int i = 0; i < 6; i++)
{
    bool s = false;
    for(int j = 0; j < 2; j++)
    {
        s = s ^ (r[i][j]<0?false:u[r[i][j]]);
    }
    v[i] = s;
}
```

FIG. 5C

Code Block 4 – Matrix Multiplication using Representation for Sparse Matrix with Unrolled Inner Loop
```
for(int i = 0; i < 6; i++)
{
    bool x = (r[i][0]<0?false:u[r[i][0]]);
    bool y = (r[i][1]<0?false:u[r[i][1]]);
    v[i] = (false ^ x) ^ y;
}
```

FIG. 5D

Code Block 5 – Matrix Multiplication using Representation for Sparse Matrix with Unrolled Loops

```
v[0] = false < (r[0][0]<0?false:u[r[0][0]]) < (r[0][1]<0?false:u[r[0][1]]);
v[1] = false < (r[1][0]<0?false:u[r[1][0]]) < (r[1][1]<0?false:u[r[1][1]]);
v[2] = false < (r[2][0]<0?false:u[r[2][0]]) < (r[2][1]<0?false:u[r[2][1]]);
v[3] = false < (r[3][0]<0?false:u[r[3][0]]) < (r[3][1]<0?false:u[r[3][1]]);
v[4] = false < (r[4][0]<0?false:u[r[4][0]]) < (r[4][1]<0?false:u[r[4][1]]);
v[5] = false < (r[5][0]<0?false:u[r[5][0]]) < (r[5][1]<0?false:u[r[5][1]]);
```

FIG. 5E

Code Block 6 – Matrix Multiplication using Representation for Sparse Matrix with Unrolled Loops and Constant Propagation

```
v[0] = false < u[0] < false;
v[1] = false < u[1] < false;
v[2] = false < u[2] < false;
v[3] = false < u[0] < u[1];
v[4] = false < u[1] < u[2];
v[5] = false < u[0] < u[2];
```

FIG. 5F

Code Block 7 – Matrix Multiplication using Representation for Sparse Matrix with Unrolled Loops, Constant Propagation, and Strength Reduction

SINGLE-IC LDPC ENCODING AND DECODING IMPLEMENTATIONS

TECHNICAL FIELD

The present disclosure relates to the field of communications over various channels in the presence of noise, and more particularly to techniques involving low-density parity-check encoding.

DESCRIPTION OF THE RELATED ART

Low-density parity-check (LDPC) codes are one example of error control code that is often used to transmit information over potentially noisy channels. For example, the WiMAX and LTE standards utilize LDPC codes for data channels. LDPC typically uses a generator matric referred to as a "G matrix" to encode communications and a parity-check matrix referred to as an "H matrix" to decode received communications.

LDPC encoding generally involves determining a matrix vector product. This computation may be implemented as a program that includes nested FOR loops. The G matrix is often fairly large, e.g., with 972×1944 entries. Executing these loops on a processor may be slow (which is typically undesirable for real-time communications) and the loops may be too large to effectively map to hardware resources (e.g., in one or more programmable hardware elements or ASICs).

SUMMARY

Various embodiments of techniques relating to parity-check encoding are disclosed. In some embodiments, an apparatus includes one or more wireless radios, one or more memories, and one or more processing elements coupled to the one or more wireless radios. In these embodiments, the apparatus is configured with a set of operations usable to produce an encoded message based on an input message. In these embodiments, the apparatus is configured to encode a message using the set of operations and transmit the encoded message. In these embodiments, the set of operations corresponds to operations generated based on a LDPC encoding matrix, using a smaller matrix that specifies location of non-zero entries in the encoding matrix.

In some embodiments, a method includes receiving data that specifies a sparse matrix for LDPC encoding, where the sparse matrix has a first size. In these embodiments, the method further includes generating a second matrix that represents the sparse matrix, where entries in the second matrix specify locations of non-zero entries in the sparse matrix, and where the second matrix is smaller than the sparse matrix. In these embodiments, the method further includes generating a set of operations usable to produce an encoded result based on entries in the smaller matrix and an input message to be encoded. In some embodiments, one or more non-transitory computer-readable media store instructions that are executable by a computing device to perform the method operations.

In some embodiments, an apparatus includes one or more wireless radios, one or more memories, and one or more processing elements coupled to the one or more wireless radios. In these embodiments, the apparatus is configured with a set of operations usable to produce an encoded message based on an input message. In these embodiments, the apparatus is configured to encode a message using the set of operations and transmit the encoded message. In these embodiments, the set of operations corresponds to operations generating, based on an encoding matrix by separately performing the following operations for different rows of the encoding matrix: generate a set of operations for entries in the row (where the set of operations for entries in the row includes respective operations to be performed on the entries for multiplication of the encoding matrix by a vector), propagate values of entries in the matrix into the set of operations for entries in the row, and simplify ones of the set of operations based on the propagated values to generate an output set of operations for the row.

In some embodiments, a method includes receiving first encoding data that corresponds to an encoding matrix. In these embodiments, the method further includes separately performing, for different rows in the encoding matrix: generating a set of operations for entries in the row, where the set of operations includes respective operations to be performed on the entries for multiplication of the matrix by a vector, propagating values of entries in the encoding matrix into the set of operations, and simplifying ones of the set of operations based on the propagated values to generate an output set of operations.

In some embodiments, an LDPC encoder and an LDPC decoder are included on the same integrated circuit. In some embodiments, circuitry included in a single integrated circuit includes: message circuitry configured to receive or generate a message to be encoded, encode circuitry configured to perform LDPC encoding on the message, noise circuitry configured to apply noise to the encoded message, and decode circuitry configured to perform LDPC decoding of the message.

BRIEF DESCRIPTION OF THE DRAWINGS

A better understanding of the present disclosure can be obtained when the following detailed description is considered in conjunction with the following drawings, in which:

FIG. 5A illustrates an exemplary code block for matrix multiplication, according to some embodiments.

FIG. 5B illustrates an exemplary code block for matrix multiplication with an unrolled inner loop, according to some embodiments.

FIG. 5C illustrates an exemplary code block for matrix multiplication using a representation for a sparse matrix, according to some embodiments.

FIG. 5D illustrates an exemplary code block for matrix multiplication using a representation for a sparse matrix and an unrolled inner loop, according to some embodiments.

FIG. 5E illustrates an exemplary code block for matrix multiplication using a representation for a sparse matrix and unrolled loops, according to some embodiments.

FIG. 5F illustrates an exemplary code block for matrix multiplication using a representation for a sparse matrix, unrolled loops, and constant propagation, according to some embodiments.

FIG. 5G illustrates an exemplary code block for matrix multiplication using a representation for a sparse matrix, unrolled loops, constant propagation, and strength reduction, according to some embodiments.

Figure 1:
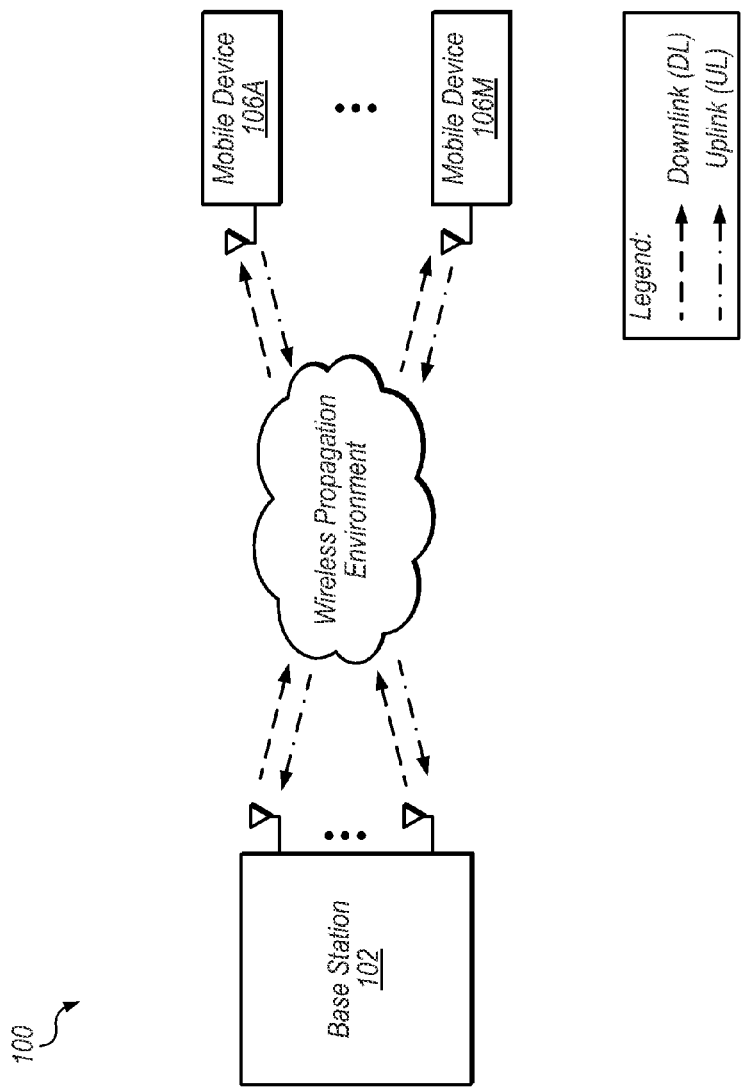
FIG. 1 illustrates exemplary wireless communications between a base station and multiple mobile devices.

While the disclosure is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present disclosure as defined by the appended claims.

The term "configured to" is used herein to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component.

DETAILED DESCRIPTION

Figure 2:
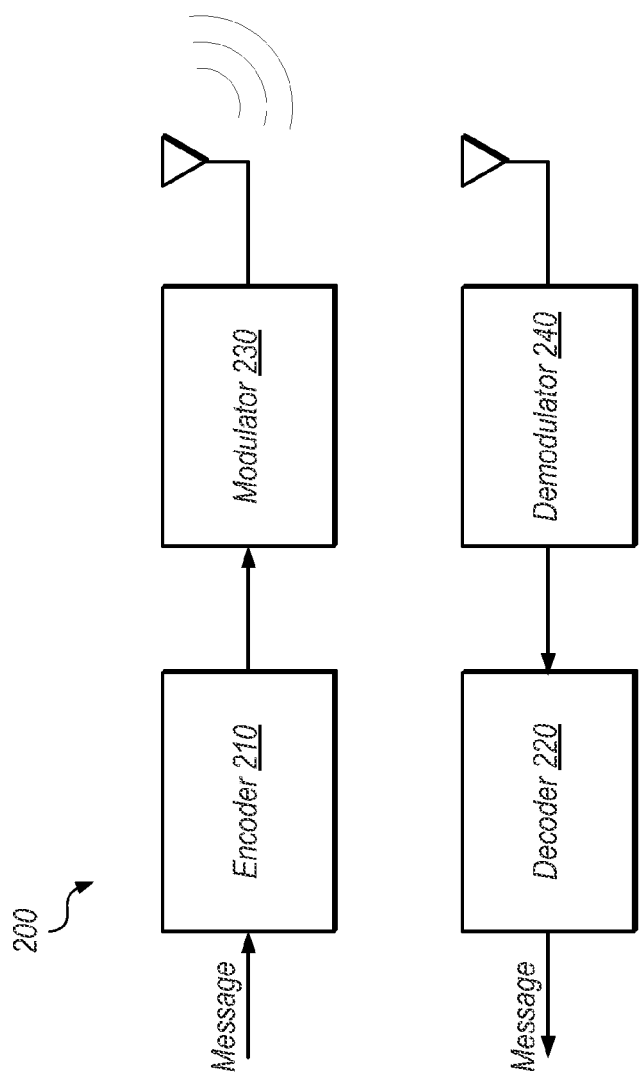
FIG. 2 illustrates exemplary encoding and decoding of messages for wireless communication.
Figures 3, 4:
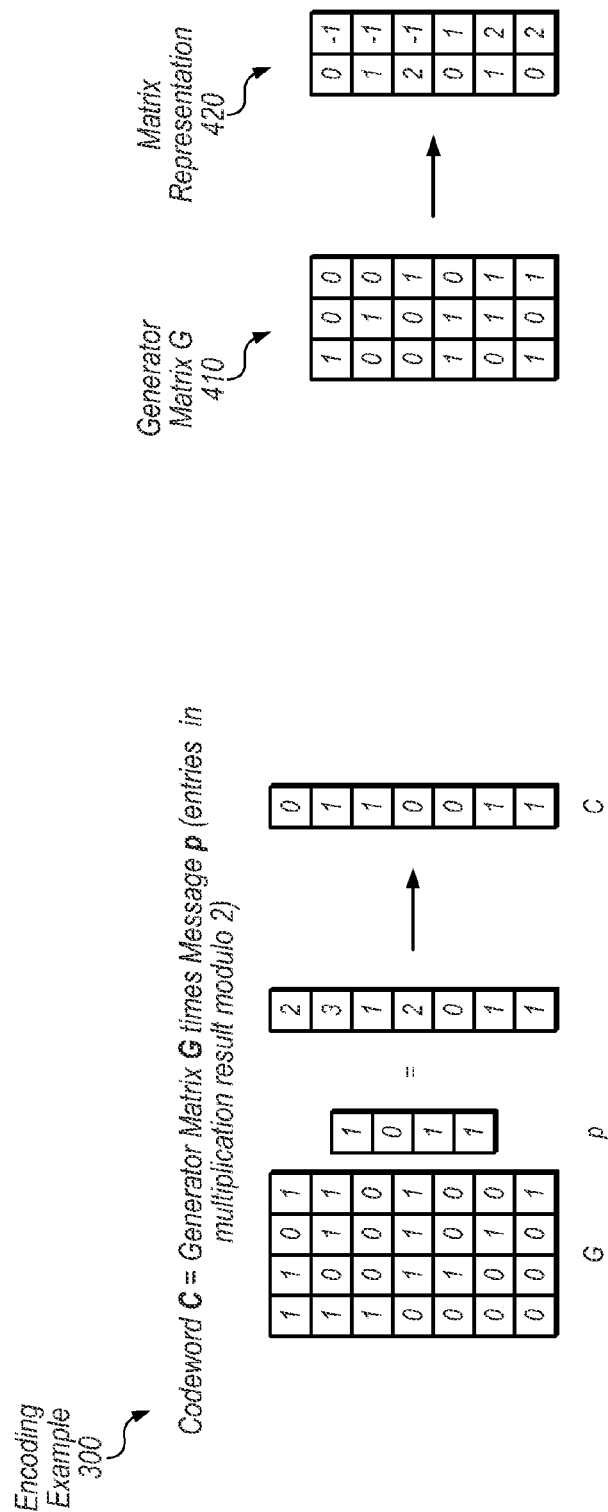
FIG. 3 illustrates an example of message encoding using a generator matrix, according to some embodiments.
FIG. 4 illustrates an exemplary representation structure for a generator matrix, according to some embodiments.

This disclosure initially describes, with reference to FIGS. 1-3, an overview of encoding techniques. Exemplary matrix representation, constant propagation, and strength reduction techniques are described with reference to FIGS. 4-9. Exemplary single-IC implementations are described with reference to FIGS. 10A-10D. In some embodiments, the disclosed techniques may reduce encoding time, reduce the area of encoding circuitry, and/or facilitate integration of various functionality onto a single integrated circuit.

TERMS

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

LDPC Overview

FIG. 1 shows an exemplary wireless communication system 100 that includes base station 102 and M mobile devices 106A-M (which may also be referred to as user equipment devices or UEs 106A-M). In the illustrated embodiment, base station 102 includes N antennas configured to transmit and receive data with mobile devices 106. In some embodiments, base station 102 may use time-division duplexing (TDD) or frequency-division duplexing (FDD), for example, to communicate with the different mobile devices. In the some embodiments, base station 102 is a multiple input multiple output (MIMO) base station, but in other embodiment non-MIMO techniques may be implemented.

In system 100, mobile devices 106 may concurrently communicate with base station 102 via the wireless propagation environment. Depending on operating conditions, data may be corrupted or lost in wireless communications and may need to be corrected or resent. Low-density parity-check (LDPC) codes are one example of error control code that is used to transmit information over potentially noisy channels, such as the illustrated wireless propagation environment. Note that in some embodiments, similar techniques may be applied to various types of communications channels including non-cellular channels, wired channels, etc. Further, in some embodiments, similar techniques may be applied to storage using one or more potentially lossy storage mediums, where data to be written is encoded and data being read is decoded. This may improve data integrity in data-center applications, e.g., in conjunction with redundant storage. Thus, the disclosed system is included for exemplary purposes and is not intended to limit the scope of the disclosure.

FIG. 2 shows one embodiment of an exemplary system that includes an LDPC decoder. In the illustrated embodiment, system 200 includes encoder 210, decoder 220, modulator 230, and demodulator 240.

Encoder 210, in the illustrated embodiment, is configured to receive a message to be transmitted, encode the message, e.g., by multiplying the message by an LDPC generator matrix (which is often denoted using the letter 'G' and may be referred to as a "G matrix"), and send the encoded message to modulator 230.

Modulator 230, in the illustrated embodiment, is configured to transform and/or group bits of the encoded message into symbols for wireless transmission to an antenna coupled to demodulator 240, i.e., to modulate the encoded message for transmission. The wireless transmission may conform to any of various transmission standards. In other embodiments, the transmission may not be wireless.

Demodulator 240, in the illustrated embodiment, is configured to demodulate the received signals to generate the encoded message. However, because of noise in transmission, it may be difficult to determine the value of elements (e.g., the polarity of bits) in the encoded message. LDPC decoding may allow accurate reconstruction of the original message in many situations.

Decoder 220, in the illustrated embodiment, is configured to reconstruct the original message, e.g., based on a parity-check matrix (which is often denoted using the letter 'H' and may be referred to as an "H matrix"), i.e., to decode the encoded message, thereby recovering the original message. Decoder 220 may be configured to transmit the decoded message to recipient hardware, not shown.

FIG. 3 illustrates an encoding example 300 of a message p, according to some embodiments. In the illustrated embodiment, p includes the data "1011." In the illustrated embodiment, encoder 210 multiplies generator matrix G by message p to generate an encoded message C (results of the operations are modulo 2 to provide binary outputs in encoded message C="0110011").

In some embodiments, G may be a much larger matrix, e.g., with 972×1944 entries or more. In these embodiments, it may be difficult to encode messages in a timely fashion using available processing resources. In various applications, G may be relatively sparse, however, with a relatively small number of relevant (e.g., non-zero) entries. Further, the G matrix may change, e.g., with updated communications standards, for different networks, etc. Therefore, mobile devices 106 may need to be reconfigured to use a new G matrix. In some embodiments, multiplication operations to multiply the G matrix by an input message are specified using inner and outer nested loop that iterate through each row in the matrix.

Exemplary Matrix Representation

FIG. 4 shows an exemplary matrix representation 420 for a generator matrix G, according to some embodiments. Matrix representation 420 may be described as a list-of-lists. As shown, each entry in matrix representation 420 indicates a location of a non-zero entry in G. For example, the top row of G has a non-zero entry at column 0 (the first column), indicated by the 0 in the upper left entry of matrix representation 420. As another example, the bottom row of G has non-zero entries at column 0 and column 2 (the rightmost column), as indicated 0 and the 2 in the bottom row of matrix representation 420. Note that, in this embodiment, an entry of "−1" does not specify the location of a non-zero entry, but rather is a padding entry for rows in which all entries are not needed to represent G.

In the illustrated embodiment, entries in G are binary. In other embodiments, similar techniques may be used for matrices with non-binary entries. In these embodiments, each entry in matrix representation 420 may indicate not only the location of populated entries in a corresponding matrix, but also the value of the specified entry.

In some embodiments, generating or using matrix representation 420 in encoder 210, rather than G itself, may reduce storage requirements and/or reduce the number of operations necessary to perform decoding, e.g., because of the typical sparseness of the G matrix. For example, if nested for loops are used to access each row and column of G or representation 420 for matrix multiplication, the number of resulting operations for representation 420 may be considerably smaller, reducing requirements for processing resources (e.g., time and/or hardware resources). In one embodiment, an exemplary 972 column by 1944 row G matrix is representable using these techniques in an 80 column by 1944 row data structure.

Various embodiments discussed herein involve techniques associated with encoding using error correcting code, and low-density parity-check (LDPC) codes in particular. However, similar techniques may be applied to various algorithms in addition to and/or in place of such encoding. LDPC codes are discussed for explanatory purposes but are not intended to limit the scope of the present techniques. The disclosed techniques may be applied in various contexts for any of various algorithms which may or may not be explicitly listed herein.

Examples of such algorithms include, without limitation: error control code, graph encoding/decoding, source coding, cryptography, maximum likelihood detector, maximum a posteriori detector, compression, multiple-input multiple-output (MIMO) communications, beam-forming, beam-steering, differential equation solving, linear equation solving, linear algebra, optimization, detection and estimation, networking, machine learning, channel estimation, image processing, motion control, process control, bioinformatics, dynamic programming, big data applications, computational informatics, internet of things, etc. Thus set of operations may be based on, and/or derived from, one or more of, without limitation: a parity-check matrix, a generator matrix, a channel matrix, the number of nodes and/or edges in a decoding algorithm, number of antennae, number of channel taps, compression ratio, angle range, degree of polynomial, number of equations, local and/or global maxima and/or minima, number of network nodes, etc.

Exemplary embodiments of linear algebra algorithms include, without limitation: symmetric rank-k update, symmetric rank-2k update, Cholesky factorization (decomposition of a positive-definite matrix into a product of a lower triangular matrix and its conjugate transpose), update Cholesky factorization (e.g., when a previously-decomposed matrix changes in some way), lower upper (LU) factorization (decomposition of a matrix into a product of a lower triangular matrix and an upper triangular matrix), QR factorization (decomposition of a matrix into a product of an orthogonal matrix Q and an upper triangular matrix R), update QR factorization, LQ factorization, triangular matrix inversion, reduction to Hessenberg form, reduction to bi-diagonal form, reduction to tri-diagonal form, triangular matrix Lyapunov equation solutions, triangular matrix Sylvester equation solutions, etc.

Exemplary Loop Unrolling, Constant Propagation, and Strength Reduction

FIGS. 5A-5G illustrate exemplary C-style code snippets that specify operations executable to perform matrix multiplication, according to some embodiments. In the illustrated examples, either the G matrix or the matrix representation are used as inputs (g[ ][ ] and r[ ][ ] respectively). For the example of FIG. 4 and the code blocks of FIGS. 5A-5E, these inputs would be initialized to:

$$
\begin{aligned}
g[6][3] = \{ & \{1, 0, 0\}, \\
& \{0, 1, 0\}, \\
& \{0, 0, 1\}, \\
& \{1, 1, 0\}, \\
& \{0, 1, 1\}, \\
& \{1, 0, 1\} \ \};
\end{aligned}
$$

$$
\begin{aligned}
r[6][2] = \{ & \{0, -1\}, \\
& \{1, -1\}, \\
& \{2, -1\}, \\
& \{0, 1\}, \\
& \{1, 2\}, \\
& \{0, 2\} \ \};
\end{aligned}
$$

For the code blocks of FIGS. 5F-5G, the values of r[ ][ ] are propagated into the program code and r[ ][ ] may not need to be initialized. In each code example, the input message is specified as a vector u[ ] and the output encoded message is stored as a vector v[ ].

FIG. 5A shows program code (code block 1) for multiplying a traditionally-represented three column by six row G matrix (stored using the data structure g[ ][ ]) by a three-bit input message array u[ ]. In the illustrated embodiment, code block 1 includes nested for loops. The outer for loop (which uses "i" indices) specifies iteration through the six rows of the G matrix while the inner for loop (which uses "j" indices) specifies iteration through the columns of each row. As shown, for each row (each outer loop) a variable "s" is initialized to false and is then set for each column (each inner loop) to s=s XOR (g[i][j] AND u[j]), where a bitwise XOR is represented by the "^" operator and a bitwise AND is represented by the "&" operator. Once these operations are performed for each row, the resulting "s" value is assigned to a position in a six-bit output encoded message array v[ ]. Execution of code block 1 results in matrix multiplication of g[ ][ ] by u[ ], in these embodiments.

FIGS. 5B-5G illustrate modifications to code block 1 that may be advantageous in various situations. These modifications may be performed by operating on code block 1 or by operating on other information (e.g., on information specifying a G matrix but not explicitly specifying the loops of code block 1). In some embodiments, a compiler is configured to implement the modifications. In some embodiments, a mobile device is configured to receive code block 1, a G matrix, or other similar operations and perform the modifications to configure itself to efficiently encode messages based on the G matrix. In some embodiments, the resulting program code is used to configure one or more programmable hardware elements (e.g., field-programmable gate arrays (FPGAs)) to perform operations to implement the functionality of code block 1. In other embodiments, the program code may be stored and executed using a processor, for example.

In FIG. 5B, code block 2 illustrates an unrolling of the inner loop of code block 1. In this code, for each iteration through the loop (for each row) v[i] is assigned the value FALSE XOR (g[i][0] AND u[0]) XOR (g[i][1] AND u[1]) XOR (g[i][2] AND u[2]). Execution of code block 2 using a microprocessor may be performed more quickly than execution of code block 1, because of the loop unrolling. Further, implementation of code block 2 may require a smaller area on a programmable hardware element than code block 1.

In FIG. 5C, code block 3 achieves the result of code block 1, using the matrix representation discussed above with reference to FIG. 4. Similarly to code block 1, code block 3 includes inner and outer loops. In the illustrated embodiment, within the nested loops, s is assigned the value s XOR (r[i][j]<0 ? FALSE: u[r[i][j]]), where the "?" and ":" operators represent a conditional statement. For example, for the statement x=A ? B: C, x is assigned the value of B if A is TRUE and x is assigned the value of C is A is FALSE. Thus, code block 3 generates the same result as code block 1, but using the list-of-lists matrix representation r[ ][ ] as an input instead of a G matrix. For this example, using the matrix representation instead of the G matrix results in twelve loop iterations rather than the eighteen iterations specified by code block 1, reducing the overall number of operations needed to encode a given input message.

In FIG. 5D, code block 4 illustrates an unrolling of the inner loop of code block 3. In this code, for each iteration through the loop (for each row) v[i] is assigned the value (FALSE XOR x) XOR y, where x=(r[i][0]<0 ? FALSE: u[r[i][0]]) and y=(r[i][1]<0 ? FALSE: u[r[i][1]]).

In FIG. 5E, code block 5 illustrates an unrolling of both inner and outer loops of code block 3. Thus, code block 5 specifies the functionality of code block 3 without looping. In the illustrated embodiment, each entry in output array v[ ] is assigned a value based on entries in r[ ][ ] and u[ ]. For example, v[1] is assigned the value FALSE XOR (r[1][0]<0 ? FALSE: u[r[1][0]]) XOR (r[1][1]<0 ? FALSE: u[r[1][1]]). In this example, each line of code 5 may be performed in parallel, as the specified operations are independent of each other. In other embodiments, one or more of the unrolled operations may be dependent on the results of previous operations, in which case at least a portion of the specified operations may be performed iteratively.

In FIG. 5F, code block 6 illustrates propagation of constants in the matrix representation r[ ][ ] into the operations of code block 5. For example, for v[1], r[1][0] is 1 and r[1][1] is -1. Therefore, the value assigned to v[1] in code block 5 would be FALSE XOR (FALSE ? FALSE: u[1]) XOR (TRUE ? FALSE: u[-1]), which is equivalent to FALSE XOR (u[1]) XOR (FALSE), as specified in the second line of code block 6. Note that in the illustrated embodiment, an entry in the sparse representation that is smaller than zero is evaluated as FALSE. Thus, propagating constant values of G or a representation of G may further simplify matrix multiplication operations.

In FIG. 5G, code block 7 illustrates application of strength reduction rules to code block 6. In the illustrated embodiment, the rule FALSE XOR x=x has been applied to the operations of code block 6. In some embodiments, any of various additional strength reduction rules may be applied such as (1) TRUE AND x=x or (2) FALSE AND x=FALSE, for example. As shown, relative to code block 1 and/or code block 3, the operations of code block 7 may be performed using a substantially smaller amount of processing resources (e.g., gates in embodiments in which code block 7 is used to configure a programmable gate array).

In some embodiments, a compiler (which may be located on a mobile device or another computing system) is configured to receive a G matrix, a matrix representation, and/or program code similar to block 1 and is configured to perform loop unrolling, transformation to a matrix representation (e.g., when G is specified), constant propagation, and/or strength reduction. In these embodiments, the compiler may configure with a device a set of operations (e.g., the operations of FIG. 7) to perform LDPC encoding. As used herein, configuring a device with a set of operations includes configuring one or more programmable hardware elements of the device to perform the operations as well as storing executable instructions specifying the set of operations in a memory of the device. In various embodiments, the disclosed techniques may improve encoding time and/or reduce the area and/or complexity of circuitry used to implement encoding. The exemplary pseudocode in FIGS. 5A-5G is exemplary and is not intended to limit the sizes of arrays/matrices, types of program code, or optimization techniques used in various embodiments.

In some embodiments, the constant propagation and strength reduction techniques are performed incrementally during loop unrolling, which may greatly reduce memory requirements relative to generating the full unrolled set of operations and then performing the propagation and reduction. These techniques are discussed in further detail below with reference to FIG. 8.

Figure 6:
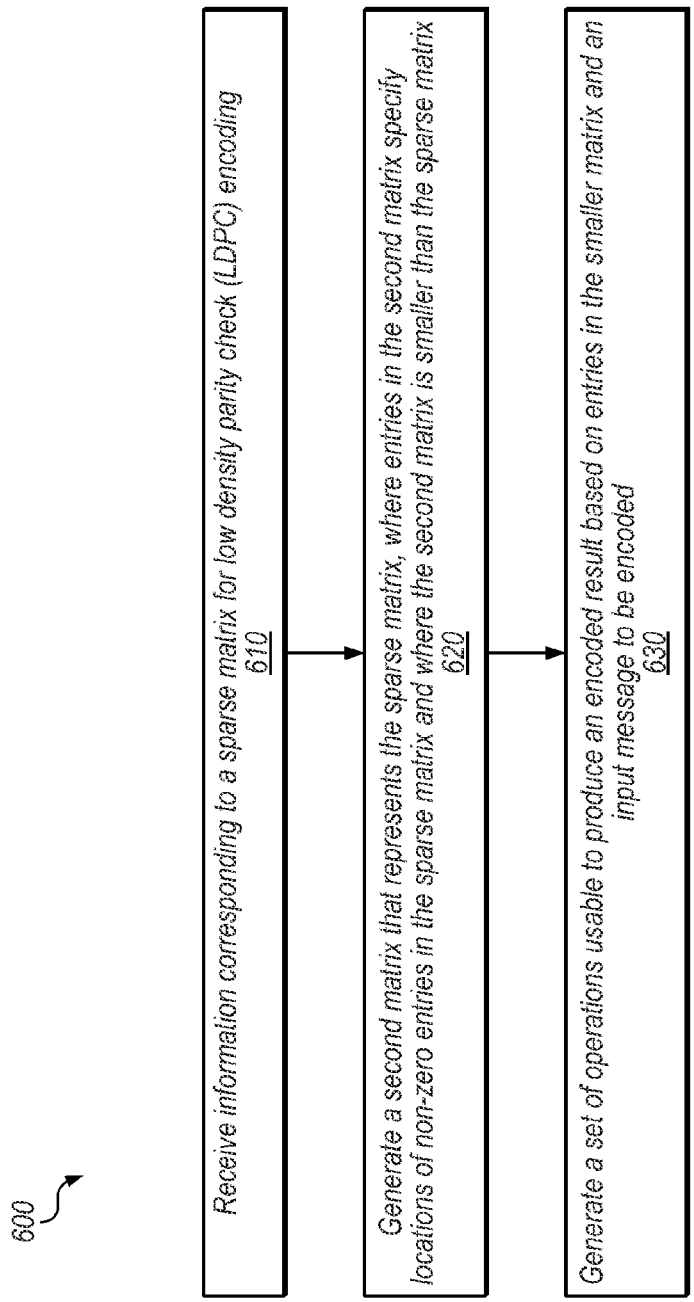
FIG. 6 is a flow diagram illustrating one embodiment of a method for configuring LDPC encoding using a smaller matrix representation.

FIG. 6 shows a flow diagram illustrating one embodiment of a method 600 for configuring LDPC encoding using a smaller matrix representation. The method shown in FIG. 6 may be used in conjunction with any of the computer systems, devices, circuits, elements, or components disclosed herein, among others. In various embodiments, some of the method elements shown may be performed concurrently, in a different order than shown, or may be omitted. Additional method elements may also be performed as desired. Flow begins at 610.

At 610, information corresponding to a sparse matrix for LDPC encoding is received. In some embodiments, a mobile device 106 or base station 102 may receive a new G matrix to be used for future communication or for communication via a particular network, for example.

At 620, a second matrix is generated that represents the sparse matrix. In the illustrated embodiment, entries in the second matrix specify locations of non-zero entries in the sparse matrix. In other embodiments, entries in the second may specify locations of otherwise relevant entries (e.g., in embodiments where non-relevant entries are specified using values other than zero). In the illustrated embodiment, the second matrix is smaller than the sparse matrix (i.e., has a smaller number of entries).

At 630, a set of operations is generated. In the illustrated embodiment, the set of operations is usable to produce an encoded result based on entries in the smaller matrix and an input message to be encoded. In some embodiments, the set of operations is generated using constant propagation from the smaller matrix and strength reduction. In these embodiments, the smaller matrix may not be stored after step 630 is complete. In other embodiments, the set of operations includes references to the smaller matrix, which may be stored and referenced by ones of the set of operations, for example.

Figure 7:
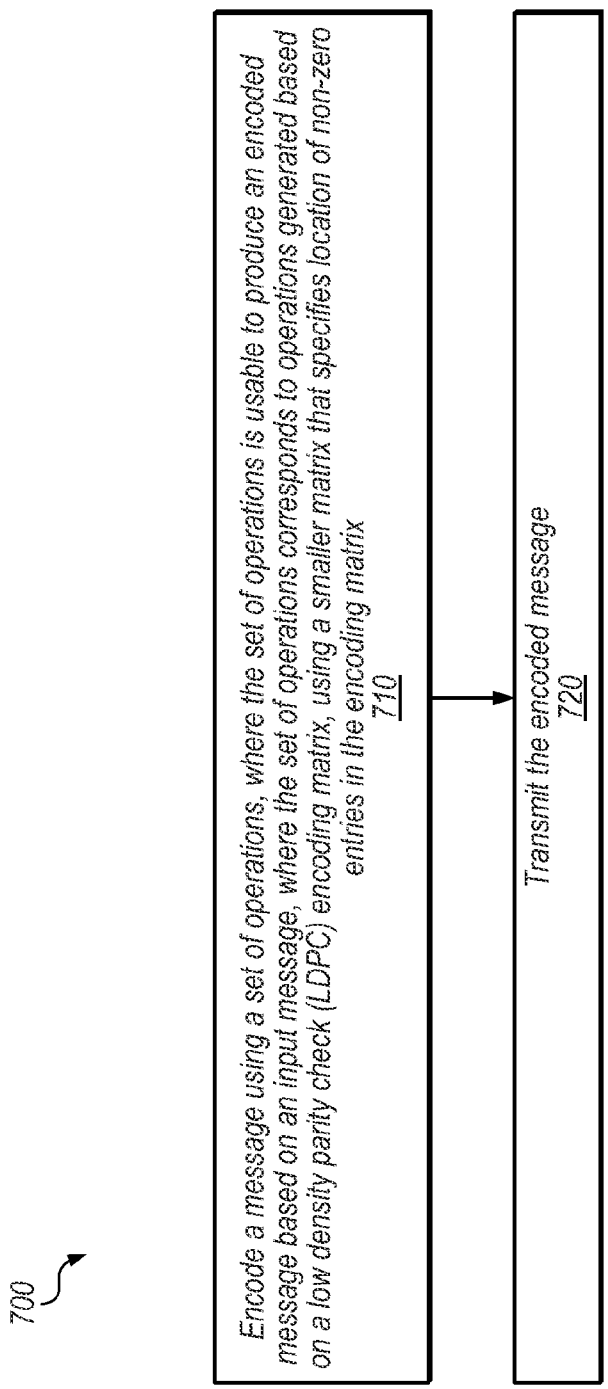
FIG. 7 is a flow diagram illustrating one embodiment of a method for encoding messages using a set of operations generating based on a smaller matrix representation.

FIG. 7 shows a flow diagram illustrating one embodiment of a method 700 for encoding messages using a set of operations generating based on a smaller matrix representation. The method shown in FIG. 7 may be used in conjunction with any of the computer systems, devices, circuits, elements, or components disclosed herein, among others. In various embodiments, some of the method elements shown may be performed concurrently, in a different order than shown, or may be omitted. Additional method elements may also be performed as desired. Flow begins at 710.

At 710, a message is encoded using a set of operations. In the illustrated embodiment, the set of operations is usable to produce an encoded message based on an input message, where the set of operations corresponds to operations generated based on a LDPC encoding matrix, using a smaller matrix that specifies location of non-zero entries in the encoding matrix. For example, the set of operations is generated, in some embodiments, according to the method of FIG. 6. Encoding the message using the set of operations may be performed quickly, relative to encoding using operations for a full G matrix. In some embodiments, using the set of operations includes operating circuitry (e.g., a programmable gate array) configured to perform the set of operations.

At 720, the encoded message is transmitted. For example, base station 102 or a mobile device 106 may transmit the message wirelessly and it may be decoded using an LDPC H matrix once received.

Exemplary Incremental Modifications

Figure 8:
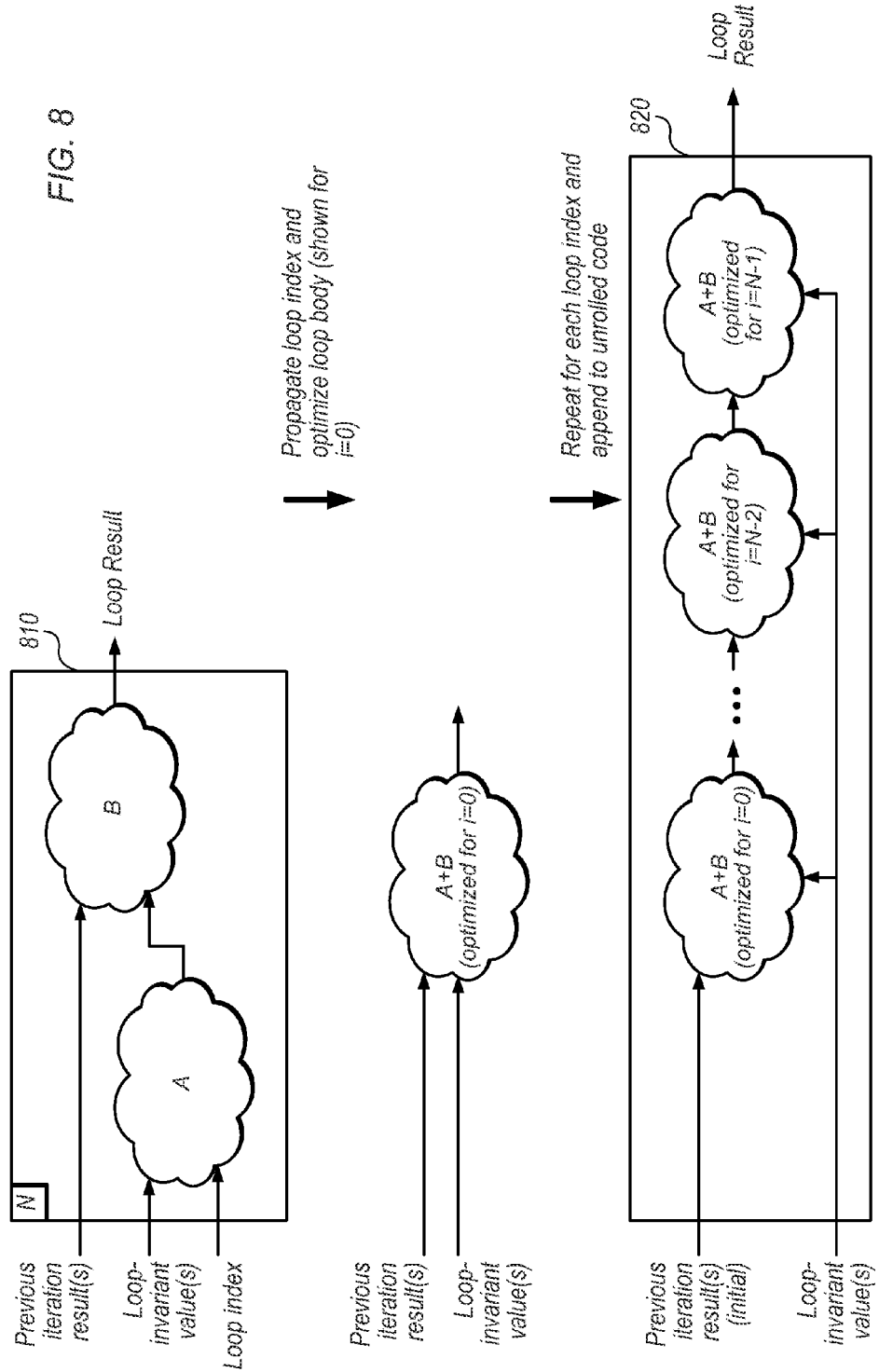
FIG. 8 is a diagram illustrating exemplary constant propagation and strength reduction, according to some embodiments.

FIG. 8 shows exemplary incremental constant propagation and strength reduction, according to some embodiments. For a typical LDPC decoder matrix, unrolling the nested loops for iteration through the matrix may require nearly 2 million copies of the inner loop body. Performing this unroll first, then modifying the code (e.g., using a matrix representation, propagating constants, and/or strength reduction) may require significant memory resources and processing time. Therefore, FIG. 8 provides an overview for an incremental modification technique in which modifications are performed during loop unrolling. Similar techniques may be used in embodiments in which loops are not explicitly specified (e.g., when data specifying a G matrix is received without associated program code).

The upper portion of FIG. 8 shows a loop body 810 that is to be performed for N iterations. As shown, the loop result is based on a function A (which is a function of loop-invariant value(s) such as entries in a G matrix and the current loop index) and function B (which is a function of previous iteration result(s) and the result of function A).

In some embodiments, the loop result for a given iteration is independent of previous iteration results and the modifications can be performed independently, e.g., in parallel. In the illustrated embodiment, because of the dependence on previous iteration results (e.g., inter-row or inter-column dependencies), the disclosed operations for each iteration through the loop are performed iteratively (i.e., operations corresponding to a particular iteration are not performed until one or more previous iterations are complete).

As shown, the current loop index (i=0 in the illustrated example) and the loop-invariant values are propagated into the loop body and optimization (e.g., strength reduction) is performed for that index, resulting in a function A+B optimized for the particular loop index.

As shown, this process is repeated for each loop index and appended to the previously-unrolled code, resulting in program code 820. In the illustrated embodiment, loop-invariant values are propagated to each code block (as discussed above, this may be performed during modification for each loop index) and program code 820 is configured to produce the result of loop body 810 without iterating through loop indices, as a result of loop unrolling.

The illustrated techniques may be performed for nested loops at various dimensions; FIG. 8 shows a single loop for illustrative purposes and is not intended to limit the scope of the disclosure. In some embodiments, as discussed above, performing constant propagation and/or strength reduction incrementally during loop unrolling (as opposed to afterwards as a separate step) may allow compilation within memory constraints and/or reduce compilation time.

Figure 9:
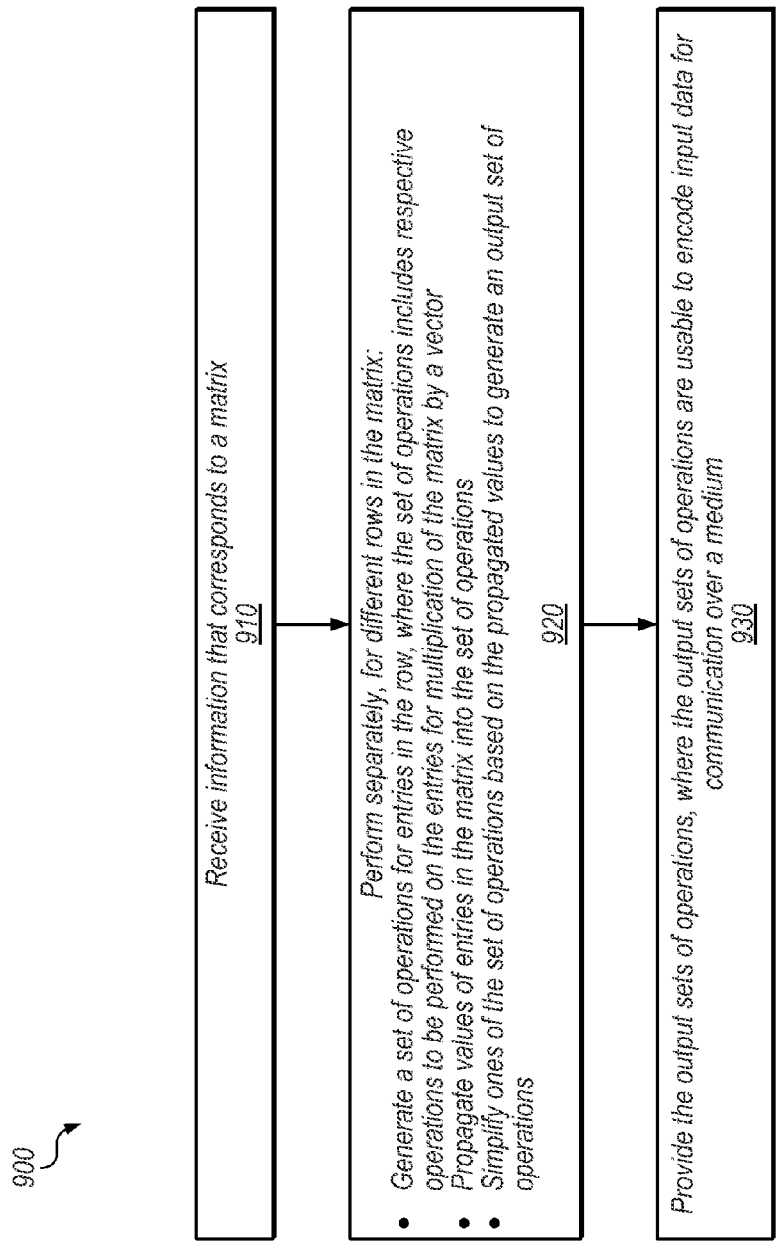
FIG. 9 is a flow diagram illustrating one embodiment of a method for configuring encoding operations using constant propagation and simplification.

FIG. 9 shows a flow diagram illustrating one embodiment of a method 900 for configuring encoding operations using incremental constant propagation and simplification. The method shown in FIG. 9 may be used in conjunction with any of the computer systems, devices, circuits, elements, or components disclosed herein, among others. In various embodiments, some of the method elements shown may be performed concurrently, in a different order than shown, or may be omitted. Additional method elements may also be performed as desired. Flow begins at 910.

At 910, information that corresponds to a matrix is received. In some embodiments, the matrix is an encoding matrix such as a LDPC G matrix.

At 920, the following operations are performed separately for different rows in the matrix: generate a set of operations for entries in the row (where the set of operations includes respective operations to be performed on the entries for multiplication of the matrix by a vector), propagate values of entries in the matrix into the set of operations, and simplify ones of the set of operations (e.g., using strength reduction techniques) based on the propagated values to generate an output set of operations. In some embodiments, the operations are to be performed iteratively for different rows of the matrix, e.g., to resolve inter-row dependencies.

At 930, the output sets of operations generated in 920 are provided, and are usable to encode input data for communication over a medium. In some embodiments, at least a portion of the output sets of operations are independent and may be performed in parallel. In some embodiments, the output sets of operations are used to configure an ASIC or programmable hardware element to perform the sets of operations.

In various embodiments, a device (e.g., a mobile device) is configured with a set of operations generated using disclosed techniques. As used herein, the term "configured with" includes both situations in which an ASIC or programmable hardware element is configured to perform the set of operations and situations in which the device stores executable program instructions that specify the set operations. The disclosed techniques may reduce compile time for encoding programs, increase encoding speed, reduce circuit area and/or power consumption for encoders, etc.

Exemplary Single-IC Implementations

In some embodiments, the disclosed techniques may allow an LDPC encoder and LDPC decoder to be included on the same integrated circuit.

Figure 10A:
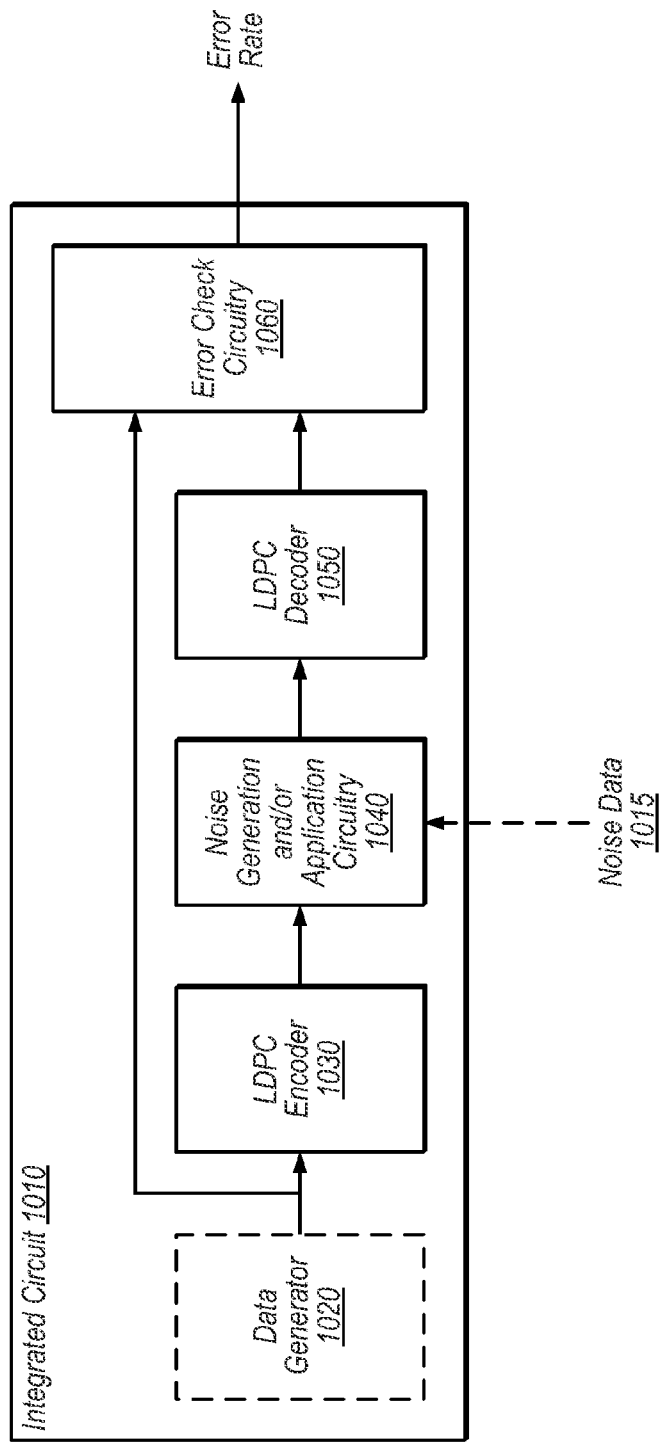
FIG. 10A is a block diagram illustrating circuitry included in a single integrated circuit, including an LDPC encoder and LDPC decoder, according to some embodiments.

FIG. 10A shows one embodiment of LDPC test circuitry included in a single integrated circuit (IC) 1010. In some embodiments, IC 1010 includes programmable hardware logic such as a field-programmable gate array (FPGA). In the illustrated embodiment, IC 1010 includes or is coupled to data generator 1020 and includes LDPC encoder 1030, noise generation and/or application circuitry 1040 (which may also be referred to as "noise circuitry" 1040), LDPC decoder 1050, and error check circuitry 1060.

Data generator 1020, in the illustrated embodiment, is shown using dashed lines to indicate that it may be included in IC 1010 or located elsewhere and coupled to IC 1010. Thus, in some embodiments IC 1010 is configured to generate message data (e.g., test data) while in other embodiments IC 1010 is configured to receive message data.

LDPC encoder 1030, in the illustrated embodiment, may be configured or configurable according to the disclosed techniques. For example, LDPC encoder may be configured using matrix representations and/or constant propagation and strength reduction (performed incrementally or otherwise). In some embodiments, LDPC encoder is reconfigurable, e.g., to test different encoding matrices with different types of messages and/or noise. In various embodiments, LDPC encoder 1030 is configured to encode data from data generator 1020 and provide encoded data to noise circuitry 1040.

Noise circuitry 1040 is configured to receive or generate noise based on noise data 1015 and apply the noise to the encoded data. In some embodiments, noise data 1015 specifies noise parameters such as signal to noise ratio (SNR), noise type, intensity, etc. In some embodiments, noise data 1015 specifies noise information itself (in these embodiments, noise circuitry 1040 may not generate noise but may simply apply it). Thus, speaking generally, noise and data for IC 1010 may be generated on-chip or externally.

LDPC decoder 1050, in the illustrated embodiment, is configured to decode noisy data from noise circuitry 1040, e.g., using an H matrix, and provide decoded data to error check circuitry 1060.

Error check circuitry 1060, in the illustrated embodiment, is configured to compare data from data generator 1020 with decoded data from LDPC decoder 1060 to determine an error rate.

IC 1010, in the illustrated embodiment, may be less expensive to produce relative to systems with similar functionality on different ICs. The disclosed encoding techniques may reduce the area of LDPC encoder 1030, allowing it to fit, along with the other processing elements of IC 1010, in a single IC. Generally, reductions in the size of IC 1010 may reduce its manufacturing costs. One or more of processing elements 1020, 1030, 1040, 1050, and 1060 may be implemented using one or more programmable gate arrays in integrated circuit 1010, while other processing elements may be implemented using ASICs, in various embodiments. Using programmable hardware elements may facilitate testing in situations where various different encoding, decoding, and/or noise techniques are desired.

Figure 10B:
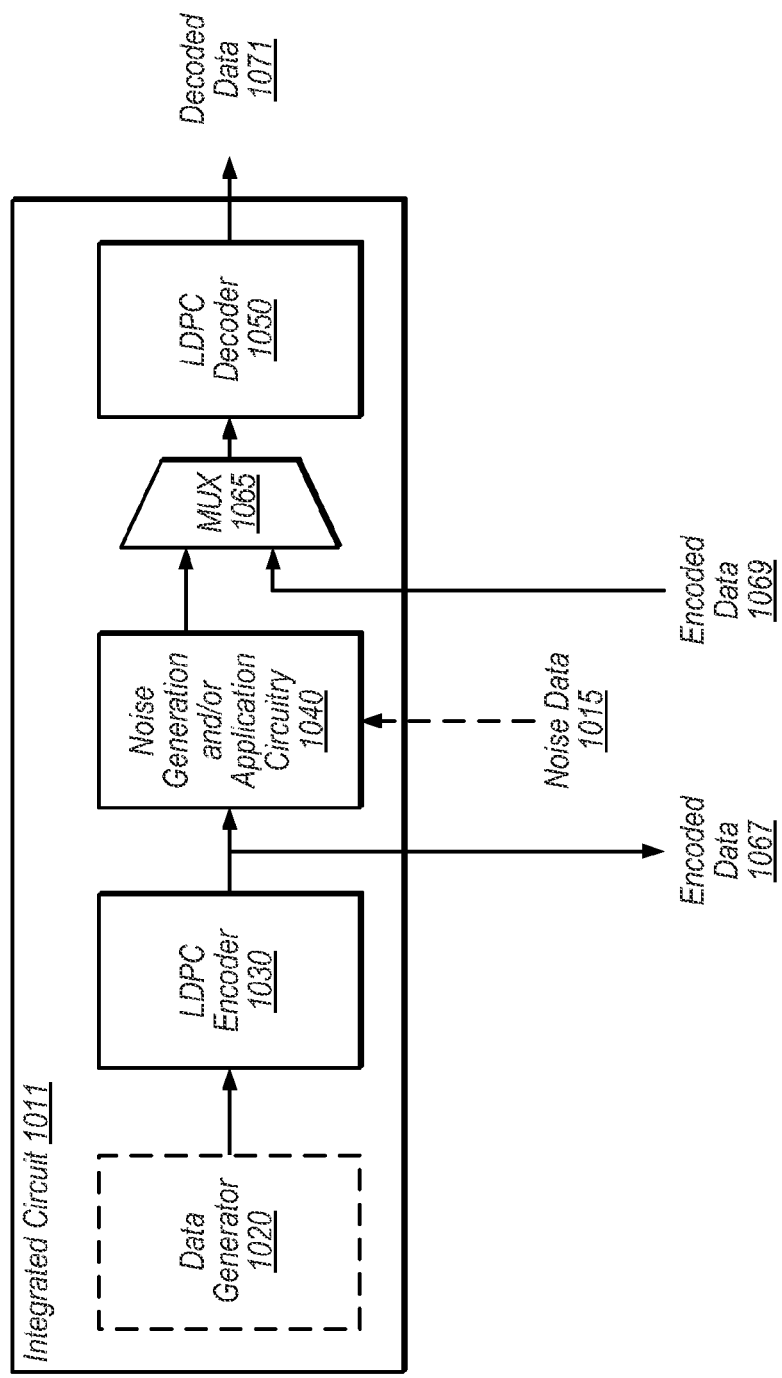
FIG. 10B is a block diagram illustrating circuitry included in a single integrated circuit, including a MUX for encoded data, according to some embodiments.

FIG. 10B shows another embodiment of LDPC test circuitry included in a single IC 1011. As shown, in some embodiments the single IC does not include error check circuitry 1060. In the illustrated embodiment, IC 1011 includes interconnect circuitry configured to deliver encoded data 1067 from LDPC encoder 1030 to an output of IC 1011 and received encoded data 1069 at an input of IC 1011, thus bypassing, in some configurations, noise circuitry 1040. This may allow IC 1011 to interface with existing external noise circuitry, for example. MUX 1065, in the illustrated embodiment, is configured to select either encoded data 1069 or data from noise circuitry 1040 based on a programmable selection signal (not shown). In the illustrated embodiment, IC 1011 is configured to output decoded data 1071.

Figure 10C:
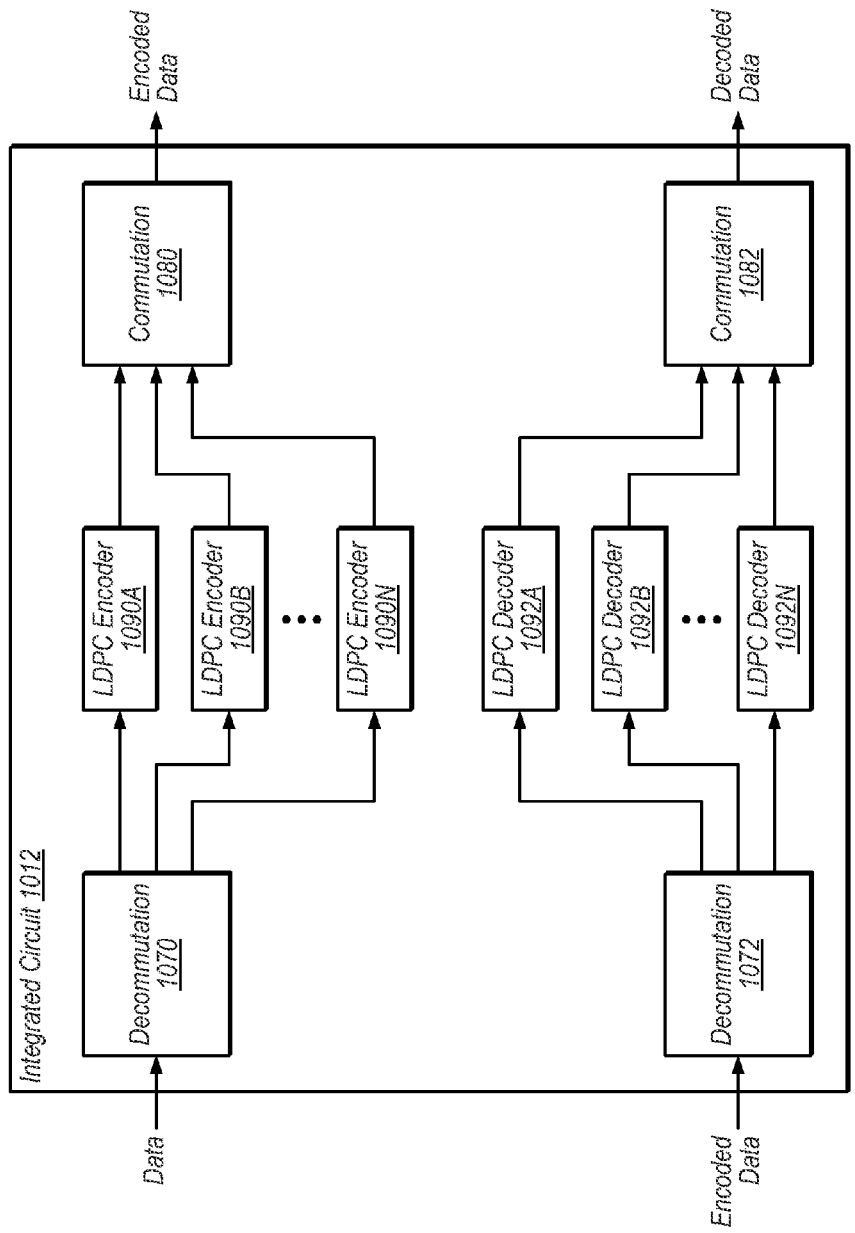
FIG. 10C is a block diagram illustrating circuitry included in a single integrated circuit, including multiple LDPC encoders and decoders, according to some embodiments.

FIG. 10C shows an embodiment of LDPC circuitry included in a single IC 1012. In some embodiments, this circuitry may be included in a mobile device 106 for example, and may reduce manufacturing costs relative to include encode and decode functionality on separate ICs. In the illustrated embodiment, IC 1012 includes decommutation elements 1070 and 1072, commutation element 1080 and 1082, LDPC encoder cores 1090A-N and LDPC decode cores 1092A-N. In some embodiments, a single LDPC encode and/or decode is included, and one or more of the decommutation and/or commutation elements may be omitted.

As shown, IC 1012 is configured to receive data (e.g., data to be transmitted wirelessly) and encoded data (e.g., data received wirelessly). In the illustrated embodiment, decommutation element 1070 is configured to distribute received data to different LDPC encoders 1090, after which the data is combined by commutation element 1080 and output as encoded data. In the illustrated embodiment, decommutation element 1072 is configured to distribute received data to different LDPC decoders 1092, after which the data is combined by commutation element 1082 and output as decoded data. In some embodiments, IC 1012 is configured to receive a parallelization parameter and is configured to alter the number of LDPC encoders and/or decoders used in parallel during a given time interval of operation based on the parallelization parameter. This may allow an increase in throughout at greater power consumption and vice versa, e.g., depending on current operating conditions. In some embodiments, the disclosed LDPC encoder techniques may facilitate placement of multiple LDPC encoder cores on a single IC.

Figure 10D:
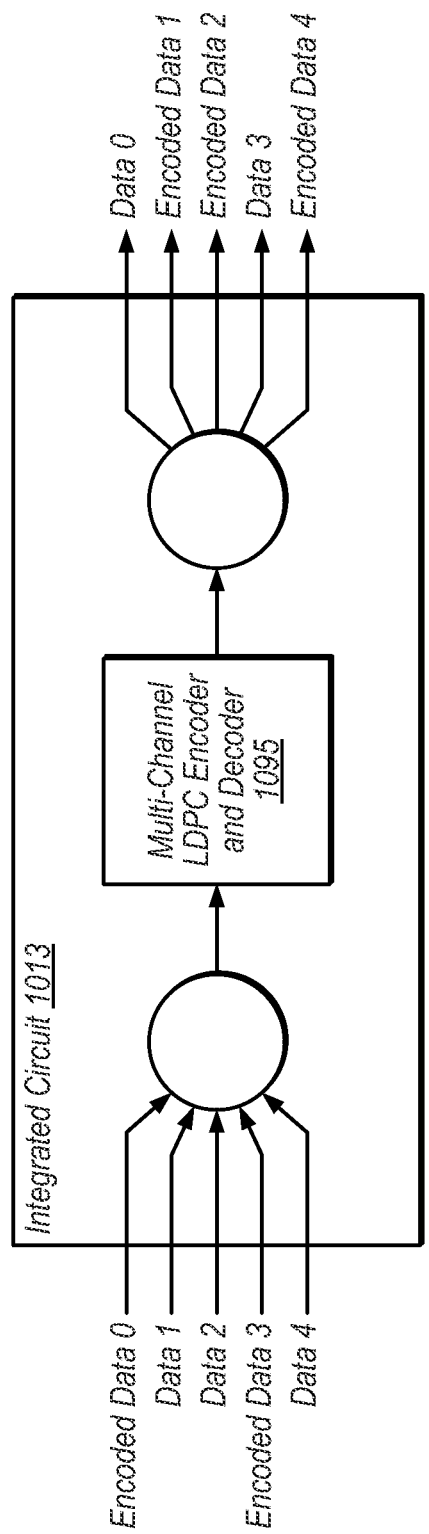
FIG. 10D is a block diagram illustrating circuitry included in a single integrated circuit, including a multi-channel LDPC encoder and decoder, according to some embodiments.

FIG. 10D shows another embodiment of LDPC circuitry included in a single IC 1013. In some embodiments, this circuitry may be included in a mobile device 106 for example, and may reduce manufacturing costs relative to include encode and decode functionality on separate ICs. In the illustrated embodiment, IC 1013 includes a multi-channel LDPC encoder and decoder 1095 configured to encode multiple different streams of encoded data and decode multiple streams of input data in parallel. In some embodiments, the disclosed LDPC encoder techniques may facilitate placement of one or more multi-channel LDPC encoders on a single IC.

The embodiments of FIGS. 10A-10D are provided to facilitate explanation of exemplary embodiments and are not intended to limit the scope of the present disclosure. In various embodiments, illustrated elements may be rearranged or omitted and/or various additional elements may be included. For example, in some embodiments, noise circuitry 1040 and/or error check circuitry 1060 may be omitted from the embodiment of FIG. 10A.

Although the embodiments above have been described in considerable detail, numerous variations and modifications will become apparent to those skilled in the art once the above disclosure is fully appreciated. It is intended that the following claims be interpreted to embrace all such variations and modifications.

We claim:
1. An apparatus, comprising:
    decode circuitry;
    message circuitry configured to receive or generate message data for a message to be encoded;

encode circuitry configured to perform low density parity check (LDPC) encoding on the message data to generate an encoded message;

noise circuitry configured to:

apply artificial noise to the encoded message to generate a noisy encoded message, wherein the artificial noise is generated based on one or more input noise parameters that specify intensity of the artificial noise, signal to noise ratio for the noisy encoded message, and a type of noise, and wherein the artificial noise is applied prior to transmitting any data associated with the encoded message to the decode circuitry; and transmit the noisy encoded message to the decode circuitry;

wherein the decode circuitry is configured to perform LDPC decoding on the noisy encoded message;

error check circuitry configured to generate error data based on a comparison of the message data and the decoded message from the decode circuitry;

wherein the message circuitry, the encode circuitry, the noise circuitry, and the decode circuitry are included on a single integrated circuit and wherein the noisy encoded message is transmitted internally via the integrated circuit.

2. The apparatus of claim 1, wherein the noise circuitry is configured to receive the one or more input noise parameters and generate the artificial noise based on the one or more input noise parameters.

3. The apparatus of claim 1, wherein the noise circuitry is configured to receive the artificial noise.

4. The apparatus of claim 1, further comprising:

one or more interconnects configurable to bypass the noise circuitry to deliver encoded messages directly to the decode circuitry.

5. The apparatus of claim 1, wherein the apparatus is a testing device configured to evaluate multiple different types of LDPC encoding in the presence of artificial noise generated based on different input noise parameters.

6. The apparatus of claim 1, wherein the encode circuitry is multi-channel circuitry configured to encode multiple channels of data in parallel.

7. The apparatus of claim 1, wherein the message circuitry, the encode circuitry, the noise circuitry, and the decode circuitry are implemented using one or more programmable gate arrays in the single integrated circuit.

8. A non-transitory computer-readable medium having instructions stored thereon that are usable, by a computing system, to configure a single integrated circuit such that the single integrated circuit includes:

decode circuitry;

message circuitry configured to receive or generate message data for a message to be encoded;

encode circuitry configured to perform low density parity check (LDPC) encoding on the message data to generate an encoded message;

noise circuitry configured to apply artificial noise to the encoded message to generate a noisy encoded message, wherein the artificial noise is generated based on one or more input noise parameters that specify intensity of the artificial noise, signal to noise ratio for the noisy encoded message, and a type of noise, and wherein the artificial noise is applied prior to transmitting any data associated with the encoded message to the decode circuitry; and transmit the noisy encoded message to the decode circuitry;

wherein the decode circuitry is configured to perform LDPC decoding on the noisy encoded message, wherein the noisy encoded message is transmitted internally via the integrated circuit; and error check circuitry configured to generate error data based on a comparison of the message data and the decoded message from the decode circuitry.

9. The non-transitory computer-readable medium of claim 8, wherein at least the encode circuitry and the decode circuitry are implemented using one or more programmable gate arrays in the single integrated circuit.

10. The non-transitory computer-readable medium of claim 8, wherein the noise circuitry is configured to receive the one or more input noise parameters and generate the artificial noise based on the one or more input noise parameters.

11. The non-transitory computer-readable medium of claim 8, further comprising:

one or more interconnects configurable to provide data from the encode circuitry to a first input/output (IO) port and receive data from a second IO port for the decode circuitry, thereby bypassing the noise circuitry.

12. The non-transitory computer-readable medium of claim 8, wherein the encode circuitry is configured encode messages based on a set of operations, wherein the set of operations corresponds to operations generated based on an LDPC encoding matrix, using a smaller matrix that specifies location of non-zero entries in the encoding matrix.

13. The non-transitory computer-readable medium of claim 8, wherein the encode circuitry is configured encode messages based on a set of operations, wherein the set of operations corresponds to operations generated, based on an LDPC encoding matrix, by separately performing, for different rows in the encoding matrix:

generating a set of operations for entries in the row, wherein the set of operations for entries in the row includes respective operations to be performed on the entries for multiplication of the encoding matrix by a vector;

propagating values of entries in the matrix into the set of operations for entries in the row; and simplifying ones of the set of operations based on the propagated values to generate an output set of operations for the row.

* * * * *